United States Patent
Lin (10) Patent No.: US 12,362,747 B2
(45) Date of Patent: Jul. 15, 2025

(54) RADIO FREQUENCY SWITCH CIRCUIT, CHIP, AND COMMUNICATION TERMINAL

(71) Applicant: VANCHIP (TIANJIN) TECHNOLOGY CO., LTD., Tianjin (CN)

(72) Inventor: Sheng Lin, Tianjin (CN)

(73) Assignee: VANCHIP (TIANJIN) TECHNOLOGY CO., LTD., Tianjin (CN)

(*) Notice: Subject to any disclaimer, the term of this patent is extended or adjusted under 35 U.S.C. 154(b) by 0 days.

(21) Appl. No.: 17/304,383

(22) Filed: Jun. 21, 2021

(65) Prior Publication Data

US 2021/0313982 A1    Oct. 7, 2021

Related U.S. Application Data

(63) Continuation of application No. PCT/CN2020/076025, filed on Feb. 20, 2020.

(30) Foreign Application Priority Data

Dec. 20, 2018  (CN) .......................... 201811561640.4

(51) Int. Cl.
 H03K 17/687  (2006.01)
 H04B 1/40    (2015.01)
(52) U.S. Cl.
 CPC ........... H03K 17/6874 (2013.01); H04B 1/40 (2013.01)

(58) Field of Classification Search
 CPC .............................. H03K 17/6874; H04B 1/40
 See application file for complete search history.

(56) References Cited

U.S. PATENT DOCUMENTS

| | | | |
|---|---|---|---|
| 9,438,223 B2* | 9/2016 | De Jongh | H03K 17/162 |
| 10,320,379 B2* | 6/2019 | Kerr | H03K 17/102 |
| 10,622,992 B2* | 4/2020 | Englekirk | H03K 17/102 |
| 10,886,911 B2* | 1/2021 | Willard | H01L 27/1203 |
| 2014/0009214 A1* | 1/2014 | Altunkilic | H03K 17/693 327/427 |

* cited by examiner

*Primary Examiner* — Menatoallah Youssef
*Assistant Examiner* — Colleen J O'Toole
(74) *Attorney, Agent, or Firm* — George Guosheng Wang; Upstream Research and Patent LLC (57) ABSTRACT

Disclosed are a radio frequency switch circuit, a chip, and a communication terminal. In the radio frequency switch circuit, a switch chain is formed by at least one switch unit being provided between a first port and a second port; each switch unit is connected to a first bias circuit and to a second bias circuit; further adjustments are made to the ratio of the parasitic capacitance between MOS transistors of each switch unit to a third capacitance; and adjustments are made to the size of said MOS transistors as well as to the ratio of said size to the third capacitance. In this way, voltage distribution uniformity on the switch chain may be improved, thus increasing the overall voltage withstand ability of the radio frequency switch circuit, and reducing the occurrence of harmonic events.

8 Claims, 6 Drawing Sheets

RADIO FREQUENCY SWITCH CIRCUIT, CHIP, AND COMMUNICATION TERMINAL

BACKGROUND

Technical Field

The present invention relates to a radio frequency switch circuit, and also to a corresponding integrated circuit chip and a communication terminal, belonging to the field of radio frequency circuit technologies.

Related Art

With the development of wireless communication technologies, communication standards have undergone the evolution of eras from 3G, 4G to 5G, and are developed from the early single standard covering several frequency bands to the current multi-standard covering a dozen or even dozens of frequency bands. To switch between different frequency bands and standards, it is necessary to use a radio frequency switch circuit. In addition, with the thinning of smartphones and the increase of components, increasingly small space is left for antennas, which severely affects the efficiency of the antennas. Therefore, a tuning switch is generally introduced to change an electrical length of an antenna, to improve the performance of the antenna.

Figure 1:
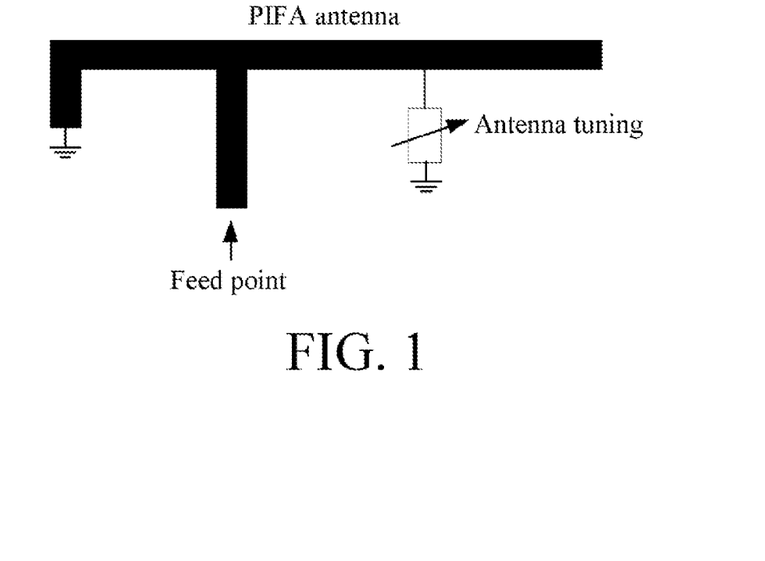
FIG. 1 is a schematic diagram of a PIFA antenna and a tuned circuit of the PIFA antenna.
Figure 2:
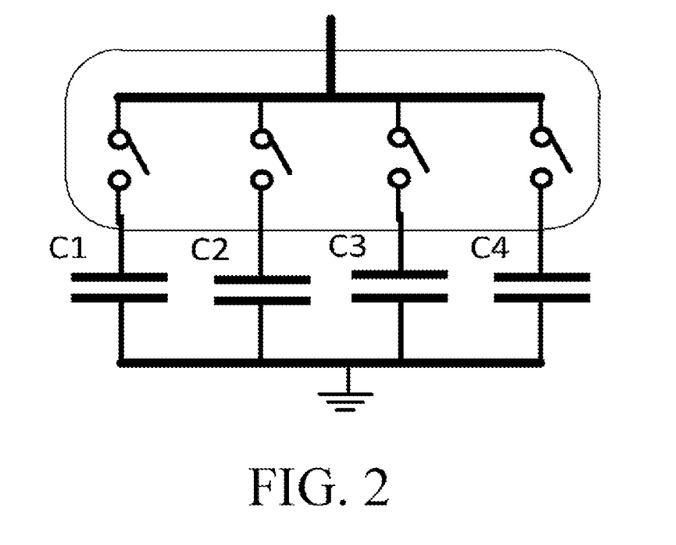
FIG. 2 is a schematic diagram of an SP4T switch circuit.

FIG. 1 is a schematic diagram of a PIFA antenna and a tuned circuit of the PIFA antenna. A dark part is the PIFA antenna of which one end is grounded, a feed point is in the middle, and a tuner is connected to an antenna arm. The tuner generally includes a single-pole multi-throw switch and a capacitor (or an inductor). The single-pole multi-throw switch may be integrated with the capacitor or may be independent. There is a single-pole four-throw (SP4T) switch in a rectangular box shown in FIG. 2. A common end of the switch is connected to the PIFA antenna arm. Four ports of the switch are respectively connected to four capacitors (capacitors C1 to C4). During an actual application, the capacitors C1 to C4 may be partially or completely replaced with inductors. When a channel of the SP4T switch is turned on and remaining three channels are turned off, switch units on the turned-off channels need to withstand voltage swings. A peak value of the voltage swings depends on a position at which the tuner is connected to the antenna. Voltage swings at different positions of the tuner are different, and a maximum voltage swing may reach 80 V or even higher.

Therefore, a voltage withstood by the single-pole multi-throw switch is allocated to each switch unit. When a voltage withstood by the each switch unit is close to a rated breakdown voltage of the single-pole multi-throw switch, harmonics generated by the single-pole multi-throw switch deteriorate. If the voltage is further increased and exceeds the breakdown voltage of the single-pole multi-throw switch, the harmonics rise in a cliff-like manner, severely affecting the antenna tuning performance.

Figure 3:
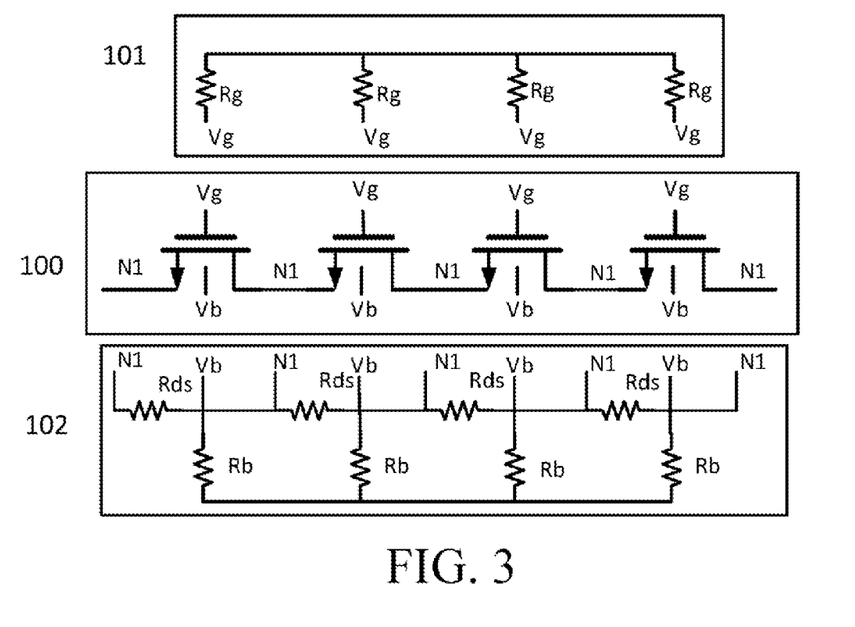
FIG. 3 is an exemplary diagram of a switch structure in the prior art.
Figure 4:
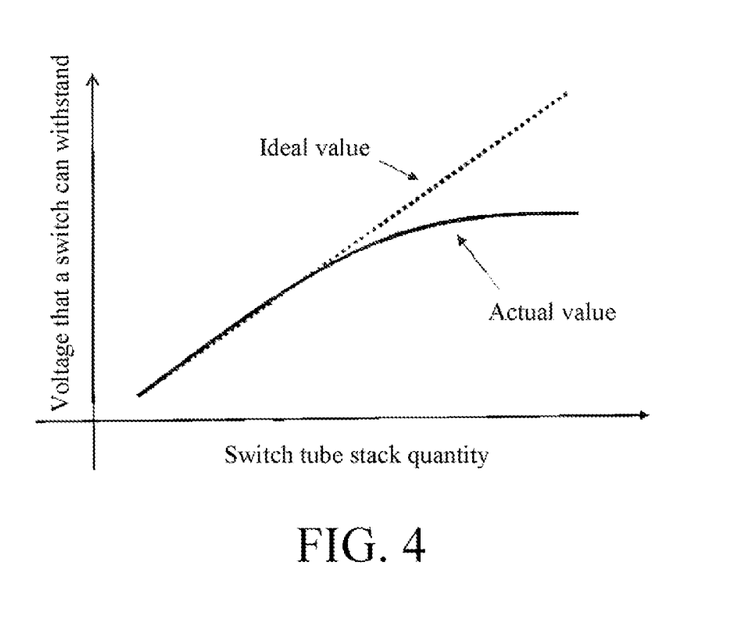
FIG. 4 is a schematic diagram of a relationship between a voltage that a switch can withstand and a switch tube stack quantity.

FIG. 3 is an exemplary diagram of a typical switch structure in the prior art. The switch structure includes three parts: a series structure 100 including one or more switch units, a gate bias circuit 101 and a body bias circuit 102. When the voltage swing withstood by the switch is increased, a voltage withstood by each switch unit increases accordingly, causing the harmonics to deteriorate. In a particular range, such a case can be improved by increasing the quantity of switch units (a tube stack quantity). FIG. 4 reflects a relationship between the voltage that the switch can withstand and the switch tube stack quantity. A dashed line and a solid line respectively correspond to an ideal value and an actual value of the voltage that the switch can withstand. When the switch tube stack quantity is relatively small, the voltage that the switch can withstand is in a linear relationship with the tube stack quantity. This is because the voltage distribution on the switch is relatively uniform in this case. Simply adding switch units can increase the voltage that the switch can withstand. In this case, the two curves coincide. As the tube stack quantity further increases, due to factors such as a parasitic capacitance effect on a substrate and a leakage current induced by the gate, the voltage that the switch withstands deviates from linearity and tends to be saturated (referring to the solid line in FIG. 4).

SUMMARY

In view of disadvantages of the prior art, the primary technical problem to be resolved by the present invention is to provide a radio frequency switch circuit.

Another technical problem to be resolved by the present invention is to provide an integrated circuit chip and a communication terminal.

In order to achieve the objective, the present invention adopts the following technical solutions.

According to a first aspect of embodiments of the present invention, a radio frequency switch circuit is provided, including a first port and a second port, wherein a switch chain is formed by at least one switch unit being provided between the first port and the second port, each switch unit is connected to a first bias circuit and to a second bias circuit, and bias voltages are connected at preset positions of the first bias circuit and the second bias circuit.

Preferably, when the switch chain includes one switch unit, an input end of the switch unit is connected to the first port, and an output end of the switch unit is connected to the second port.

Preferably, when the switch chain includes two or more switch units, an output end of each of the switch units is connected to an input end of a next switch unit, an input end of the first switch unit of the switch chain is connected to the first port, and an output end of the last switch unit of the switch chain is connected to the second port.

Preferably, each switch unit includes a metal-oxide-semiconductor (MOS) transistor, a first resistor is disposed between a source and a drain of the MOS transistor, and a gate and a body of the MOS transistor are respectively connected to corresponding bias circuits.

Preferably, the first bias circuit includes at least one first T-shaped resistance network, each first T-shaped resistance network is correspondingly connected to a gate of one MOS transistor, and first capacitors are respectively disposed between the first first T-shaped resistance network and the first port and between the last first T-shaped resistance network and the second port.

Preferably, each first T-shaped resistance network includes a second resistor, two adjacent first T-shaped resistance networks share a third resistor, two ends of the third resistor are correspondingly connected to ends of second resistors of the two adjacent first T-shaped resistance networks, the other end of the second resistor is connected to a gate of a corresponding MOS transistor, and one end of a second resistor of the first first T-shaped resistance network and one end of a second resistor of the last first T-shaped resistance network are respectively connected to the corresponding first capacitors by using third resistors.

Preferably, the second bias circuit includes at least one second T-shaped resistance network, each second T-shaped resistance network is correspondingly connected to a body of one MOS transistor, and second capacitors are respectively disposed between the first second T-shaped resistance network and the first port and between the last second T-shaped resistance network and the second port.

Preferably, each second T-shaped resistance network includes a fourth resistor, two adjacent second T-shaped resistance networks share a fifth resistor, two ends of the fifth resistor are correspondingly connected to ends of fourth resistors of the two adjacent second T-shaped resistance networks, the other end of the fourth resistor is connected to a body of a corresponding MOS transistor, and one end of a fourth resistor of the first second T-shaped resistance network and one end of a fourth resistor of the last second T-shaped resistance network are respectively connected to the corresponding second capacitors by using fifth resistors.

Preferably, resistors in the first T-shaped resistance network and resistors in the second T-shaped resistance network respectively use variable resistor arrays, and the first capacitors and the second capacitors respectively use capacitor arrays.

Preferably, when the radio frequency switch circuit is bidirectional, both the first port and the second port are used as input ports of a radio frequency signal.

Preferably, when the radio frequency switch circuit is unidirectional, one of the first port and the second port is used as an input port of a radio frequency signal, and the other port is grounded.

Preferably, a third capacitor is disposed between a source and a body of an MOS transistor of each switch unit; and a ratio of a parasitic capacitance between MOS transistors to a capacitance of the third capacitor is adjusted, to improve voltage distribution uniformity on the switch chain when the radio frequency switch circuit is turned off.

Preferably, a size of the MOS transistor of the each switch unit and a ratio of the size to a size of the third capacitor are adjusted, to improve voltage distribution uniformity on the switch chain when the radio frequency switch circuit is turned off, where the size of the MOS transistor is a width/length (W/L) ratio of a gate of the MOS transistor.

Preferably, when the radio frequency switch circuit is bidirectional, if a quantity of the switch units is an odd number, a bias voltage is connected at a mid-point of two third resistors in first T-shaped resistance networks that are connected to the switch unit in the middle, and a bias voltage is connected at a mid-point of two fifth resistors in second T-shaped resistance networks that are connected to the switch unit in the middle; and if the quantity of the switch units is an even number, bias voltages are respectively connected at central points of the third resistor and the fifth resistor that are in the middle.

Preferably, when the radio frequency switch circuit is unidirectional, bias voltages are respectively connected from sides that are of the first bias circuit and the second bias circuit and close to the ground.

According to a second aspect of the embodiments of the present invention, an integrated circuit chip is provided, including the foregoing radio frequency switch circuit.

According to a third aspect of the embodiments of the present invention, a communication terminal is provided, including the foregoing radio frequency switch circuit.

In the radio frequency switch circuit provided in the present invention, a switch chain is formed by at least one switch unit disposed between the first port and the second port, each switch unit is connected to the first bias circuit and the second bias circuit, and the ratio of the parasitic capacitance between MOS transistors of the switch units to the capacitance of the third capacitor, the size of the MOS transistor of the each switch unit, and the ratio of the size to the size of the third capacitor are further adjusted. In this way, voltage distribution uniformity on the switch chain can be improved, thereby improving the overall voltage withstanding ability of the radio frequency switch circuit and reducing the occurrence of harmonics.

DETAILED DESCRIPTION

The technical content of the present invention is further described below in detail with reference to the accompanying drawings and specific embodiments.

EMBODIMENT 1

Figure 5:
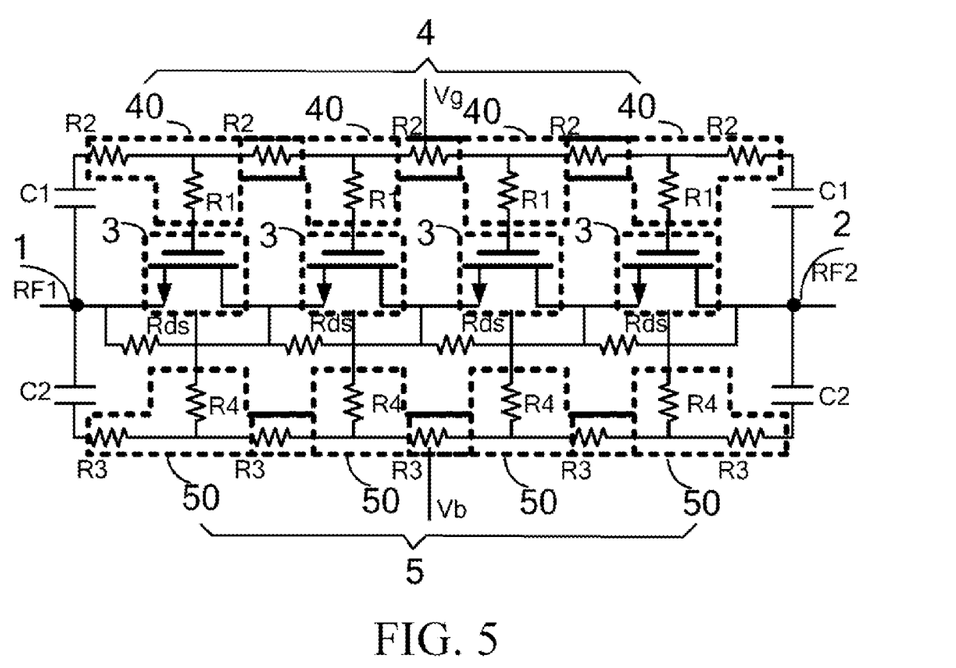
FIG. 5 is a circuit principle diagram of a radio frequency switch circuit according to an Embodiment 1 of the present invention.

As shown in FIG. 5, a radio frequency switch circuit provided in Embodiment 1 includes a first port 1 and a second port 2. A switch chain is formed by at least one switch unit 3 between the first port 1 and the second port 2. Each switch unit 3 is connected to a first bias circuit 4 and to a second bias circuit 5, and bias voltages are connected at preset positions of the first bias circuit 4 and the second bias circuit 5.

When the switch chain includes one switch unit 3, an input end of the switch unit is used as an input end of the switch chain, and an output end of the switch unit is used as an output end of the switch chain. The input end of the switch unit 3 is connected to the first port 1, and the output end of the switch unit 3 is connected to the second port 2. Both the first port 1 and the second port 2 are used as input ports of a radio frequency signal, so that the radio frequency switch circuit is bidirectional. The radio frequency signal may be inputted from any one of the ports. The switch chain uses one switch unit to connect or cut off signals at two ends of the switch chain.

When the switch chain includes two or more switch units 3, an output end of each of the switch units 3 is connected to an input end of a next switch unit; and an input end of the first switch unit 3 of the switch chain is connected to the first port 1, and the input end of the first switch unit 3 is the input end of the switch chain. An output end of the last switch unit 3 of the switch chain is connected to the second port 2, and the output end of the last switch unit 3 is used as the output end of the switch chain. Similarly, the radio frequency switch circuit is bidirectional, and the radio frequency signal may be inputted from any one of the ports. The switch chain uses two or more switch units to meet index requirements in different aspects while ensuring the connection or cutting off of signals at two ends of the switch chain.

In this embodiment of the present invention, the switch unit 3 may be implemented by using a metal-oxide-semiconductor (MOS) transistor, which may be specifically a complementary metal-oxide-semiconductor (CMOS) transistor or a silicon-on-insulator N-channel metal oxide semiconductor (SOI NMOS) transistor. To facilitate the understanding of this embodiment of the present invention, descriptions are made below in detail by using an example in which each switch unit 3 uses an SOI NMOS transistor (briefly referred to as NMOS transistors). However, the corresponding technical solutions are also applicable to other types of MOS transistors such as CMOS transistors.

As shown in FIG. 5, a source of the NMOS transistor is used as the input end of the switch unit 3, and a drain of the NMOS transistor is used as the output end of the switch unit 3. A first resistor Rds is disposed between the source and the drain of the NMOS transistor to establish bias voltages for a drain and a source of each NMOS transistor, so that direct-current voltages at the drain and the source of the each NMOS transistor are equal. A gate of the NMOS transistor is connected to the first bias circuit 4, and a body of the NMOS transistor is connected to the second bias circuit 5. The gate of the NMOS transistor is controlled by using the first bias circuit 4, so as to reduce the loss of the radio frequency signal on the gate when the NMOS transistor is turned on, and improve voltage distribution uniformity on the switch chain when the NMOS transistor is turned off, thereby improving the voltage withstanding ability of the radio frequency switch circuit and improving the harmonic performance.

As shown in FIG. 5, the first bias circuit 4 is connected to a gate of an NMOS transistor of each switch unit, and the second bias circuit 5 is connected to a body of the NMOS transistor of the each switch unit. The first bias circuit 4 includes at least one first T-shaped resistance network 40. Each first T-shaped resistance network 40 is correspondingly connected to a gate of an NMOS transistor of a switch unit 3. Furthermore, a first capacitor C1 is disposed between a first T-shaped resistance network 40 connected to the first switch unit 3 and the first port 1, and a first capacitor C1 is also disposed between a first T-shaped resistance network 40 connected to the last switch unit 3 and the second port 2.

Specifically, as shown in FIG. 5, each first T-shaped resistance network 40 includes a second resistor R1. Two adjacent first T-shaped resistance networks 40 share a third resistor R2. Two ends of the third resistor R2 are correspondingly connected to ends of second resistors R1 of the two adjacent first T-shaped resistance networks 40, and the other end of the second resistor R1 is connected to a gate of an NMOS transistor of a corresponding switch unit. One end of a second resistor R1 of the first first T-shaped resistance network 40 and one end of a second resistor R1 of the last first T-shaped resistance network 40 are respectively connected to the corresponding first capacitors C1 by using third resistors R2. The first capacitor C1 may be a metal-insulator-metal (MIM) capacitor, or may be a parasitic capacitor formed between metals. The capacitance density of the MIM capacitor is larger than that of the parasitic capacitor. Therefore, if a required capacitance value is relatively large, the MIM capacitor may be used, which occupies a small area. If the required capacitance value is relatively small, the parasitic capacitor formed between metals may be used. The parasitic capacitor is generated through the overlap between metal connection lines at different levels, and generally has lower capacitance density.

When the radio frequency switch circuit is turned on, the leakage of the radio frequency signal in the direction is blocked by using the second resistor R1, thereby reducing the loss of the radio frequency signal on the gate. As shown in FIG. 5, in an example in which the switch chain includes four switch units 3, a voltage at one end of the switch chain is set to 12 V, and the other end is grounded, when the radio frequency switch circuit is turned off, ideally, a 12 V voltage is evenly distributed on NMOS transistors of the four switch units 3, and a voltage on each NMOS transistor is 3 V. However, due to a parasitic capacitance, the voltages distributed on the switch units 3 are no longer uniform. For example, a voltage that the NMOS transistor of the first switch unit 3 withstands is 4 V, which exceeds a rated voltage (for example, 3.5 V) that the NMOS transistor of the switch unit 3 can withstand under a selected process, causing harmonics of the radio frequency switch circuit to sharply deteriorate.

In the radio frequency switch circuit, due to the use of the first T-shaped resistance networks 40, voltage drops generated by the leakage current on the first T-shaped resistance networks 40 are more uniform between the drain and the source of each switch unit 3. This is because the first T-shaped resistance networks 40 are also cascaded and the third resistors R2 are all equal. Furthermore, the radio frequency switch circuit further adjusts, by using the first capacitor C1, impedance generated by the first NMOS transistor, which is also conducive to alleviating voltage distribution nonuniformity on the switch chain. Therefore, the voltage distribution uniformity on the switch chain is improved by using the first T-shaped resistance network 40, the voltage withstanding ability of the radio frequency switch circuit is improved, and the harmonic performance is optimized.

As shown in FIG. 5, the gate and the body of the NMOS transistor of each switch unit 3 correspond to each other. To maintain the symmetry of circuits of the radio frequency switch circuit, a second bias circuit 5 with the same structure as that of the first bias circuit 4 needs to be disposed on the body of each switch unit. The second bias circuit 5 includes at least one second T-shaped resistance network 50. Each second T-shaped resistance network 50 is correspondingly connected to a body of an NMOS transistor of a switch unit 3. Furthermore, a second capacitor C2 is disposed between a second T-shaped resistance network 50 connected to the first switch unit 3 and the first port 1, and a second capacitor C2 is also disposed between a second T-shaped resistance network 50 connected to the last switch unit 3 and the second port 2.

Specifically, as shown in FIG. 5, each second T-shaped resistance network 50 includes a fourth resistor R4. Two adjacent second T-shaped resistance networks 50 share a fifth resistor R3. Two ends of the fifth resistor R3 are correspondingly connected to ends of fourth resistors R4 of the two adjacent second T-shaped resistance networks 50, and the other end of the fourth resistor R4 is connected to a body of an NMOS transistor of a corresponding switch unit 3. One end of a fourth resistor R4 of the first second T-shaped resistance network 50 and one end of a fourth resistor R4 of the last second T-shaped resistance network 50 are respectively connected to the corresponding second capacitors C2 by using fifth resistors R3.

It should be noted that, resistors (including the second resistors R1, the third resistors R2, the fourth resistors R4, and the fifth resistors R3) in the first T-shaped resistance network 40 and the second T-shaped resistance network 50 may be variable resistor arrays. The first capacitors C1 and the second capacitors C2 may be capacitor arrays.

In addition, a bias voltage Vg is connected at a preset position of the first bias circuit 4, and a bias voltage Vb is connected at a preset position of the second bias circuit 5. The connection manner of the bias voltage Vg and the bias voltage Vb may depend on the quantity of the switch units 3. In addition, to maintain the symmetry of circuits of the radio frequency switch circuit, the connection manner of the bias voltage Vg and the bias voltage Vb is related to parity. If the quantity of the switch units 3 is an odd number, the bias voltage Vg is connected at a mid-point between two third resistors R2 in first T-shaped resistance networks 40 that are connected to the switch unit 3 in the middle, and the bias voltage Vb is connected at a mid-point between two fifth resistors R3 in second T-shaped resistance networks 50 that are connected to the switch unit 3 in the middle. If the quantity of the switch units 3 is an even number, the bias voltage Vg is connected at a central point of the third resistor R2 in the middle (as shown in FIG. 5), and the bias voltage Vb is connected at a central point of the fifth resistor R3 in the middle (as shown in FIG. 5). A person skilled in the art should learn that, there is not only one connection manner of the bias voltage Vg and the bias voltage Vb. The bias voltage Vg and the bias voltage Vb may be connected at other positions of the first bias circuit 4 and the second bias circuit 5.

EMBODIMENT 2

Figure 6:
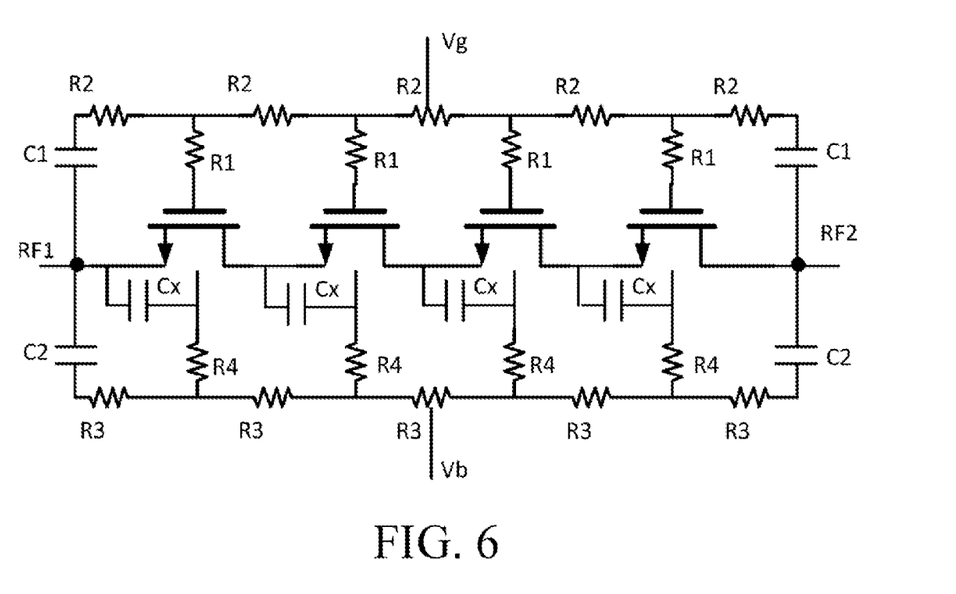
FIG. 6 is a circuit principle diagram of a radio frequency switch circuit according to an Embodiment 2 of the present invention.

As shown in FIG. 6, an example in which the switch units 3 respectively use NMOS transistors is used. Based on the radio frequency switch circuit provided in Embodiment 1, in a radio frequency switch circuit provided in this embodiment, a third capacitor Cx is disposed between the source and the body of the NMOS transistor of each of the switch units 3. The third capacitor Cx is used as a compensation capacitor of the switch unit 3. Alternatively, the third capacitor Cx may be disposed between the source and the gate of the NMOS transistor of each switch unit 3. The sizes of the NMOS transistors of the switch units may be different, and larger sizes of the NMOS transistors of the switch units 3 indicate larger parasitic capacitances. Therefore, a ratio of a parasitic capacitance between the NMOS transistors of the switch units 3 to a capacitance of the third capacitor Cx is adjusted, to further improve voltage distribution uniformity on the switch chain when the radio frequency switch circuit is turned off, thereby improving the voltage withstanding ability of the radio frequency switch circuit and improving harmonic performance. Specifically, in a design process of the radio frequency switch circuit, an initial ratio of the parasitic capacitance between the NMOS transistors of the switch units 3 to the capacitance of the third capacitor Cx is selected first, voltages distributed on the switch units 3 are calculated through simulation, and whether voltages on one or more switch units 3 exceed a rated voltage is observed. This process is iterated until a ratio making the voltage distribution on the switch chain most uniform is selected.

EMBODIMENT 3

Figure 7:
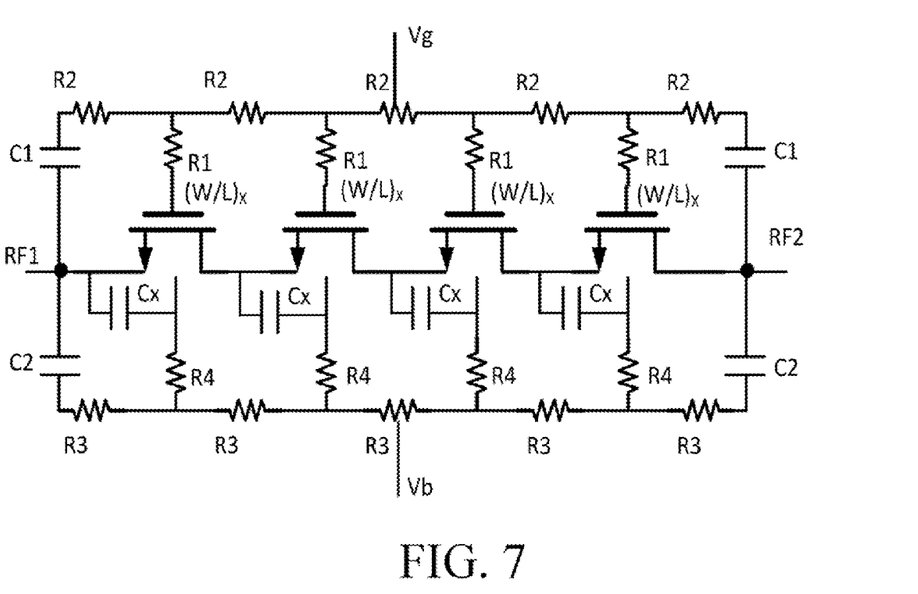
FIG. 7 is a circuit principle diagram of a radio frequency switch circuit according to an Embodiment 3 of the present invention.

As shown in FIG. 7, an example in which the switch units 3 respectively use NMOS transistors is used. Based on the radio frequency switch circuit provided in Embodiment 2, in a radio frequency switch circuit provided in this embodiment, the W/L ratio of the gate of the NMOS transistor of each switch unit 3 is further adjusted. Specifically, a voltage withstanding value of the NMOS transistor of each switch unit 3 is related to the length of the gate of the NMOS transistor. A larger length L of the gate of the NMOS transistor indicates a higher voltage withstanding value of the NMOS transistor, which is conducive to improving the voltage withstanding ability when the radio frequency switch circuit is turned off. However, when the NMOS transistor is turned on, the impedance of the NMOS transistor becomes higher, causing higher insertion loss. To maintain a proper insertion loss value, the width W of the radio frequency switch circuit may be increased. In this case, an overlap capacitance between the gate and the source of the NMOS transistor is increased, and poly contact on the drain and the source of the NMOS transistor increases the spacing as the length L of the gate increases, resulting in a decrease in the parasitic capacitance between NMOS transistors. In addition, the size of the NMOS transistor of each switch unit 3 and a ratio of the size to a size of the third capacitor Cx are adjusted, to improve voltage distribution uniformity on the switch chain when the radio frequency switch circuit is turned off. Adjusting the size of the NMOS transistor of each switch unit 3 is adjusting the W/L ratio of the gate of the NMOS transistor of the each switch unit 3. Specifically, the size of each MOS transistor contributes to one part of the overall parasitic capacitance of the radio frequency switch circuit, and the other part of the overall parasitic capacitance is contributed to by metal connection lines. The impedance generated by each NMOS transistor can be changed by changing the size of the each NMOS transistor and the ratio of the size to the size of the third capacitor Cx. The voltage nonuniformity withstood by each switch unit 3 is a product of the impedance from each NMOS transistor and a leakage current. Therefore, voltage distribution uniformity on the switch chain can be improved by adjusting the size of the NMOS transistor of each switch unit 3 and the ratio of the size to the size of the third capacitor Cx.

EMBODIMENT 4

Figure 8:
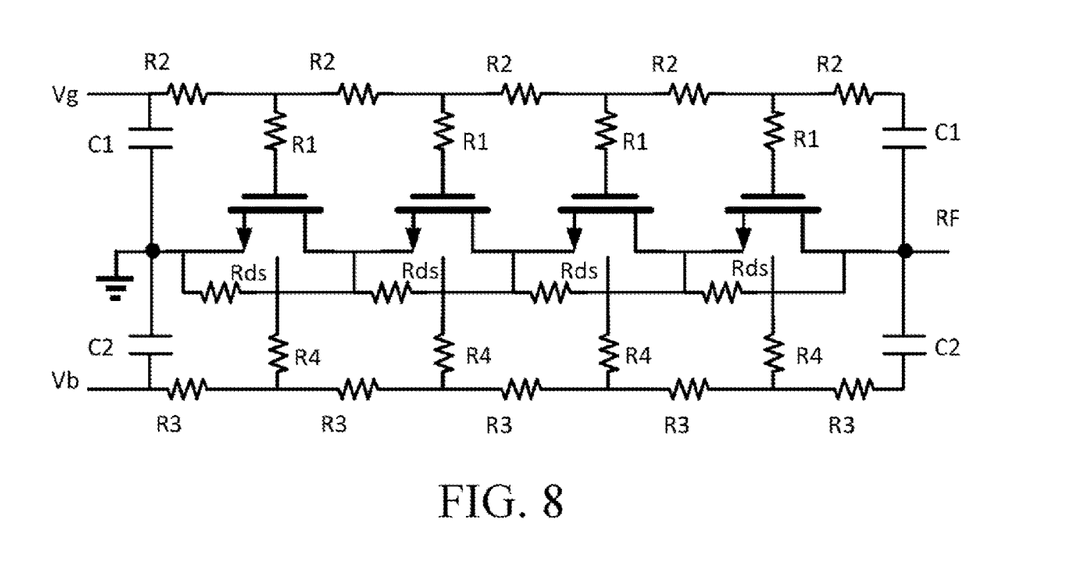
FIG. 8 is a circuit principle diagram of a radio frequency switch circuit according to an Embodiment 4 of the present invention.

As shown in FIG. 8, a difference between a radio frequency switch circuit in this embodiment and the radio frequency switch circuit in Embodiment 1 lies in that, one of the first port 1 and the second port 2 is used as an input port of a radio frequency signal, and the other port is grounded. The radio frequency switch circuit is unidirectional. The radio frequency signal is inputted from only one port, and the other port cannot receive the radio frequency signal all the time.

When the radio frequency switch circuit is turned on, the leakage of the radio frequency signal in the direction is blocked by using the second resistor R1, thereby reducing the loss of the radio frequency signal on the gate. When the radio frequency switch circuit is turned off, due to the use of the first T-shaped resistance networks 40, voltage drops generated by the leakage current on the first T-shaped resistance networks 40 are more uniform between the drain and the source of each switch unit 3. Furthermore, the radio frequency switch circuit further adjusts, by using the first capacitor C1, impedance encountered by the first NMOS transistor, which is conducive to alleviating voltage distribution nonuniformity on the switch chain.

Therefore, the voltage distribution uniformity on the switch chain is improved by using the first T-shaped resistance network 40, the voltage withstanding ability of the radio frequency switch circuit is improved, and the harmonic performance is optimized.

The bias voltage Vg is connected at the preset position of the first bias circuit 4, and the bias voltage Vb is connected at the preset position of the second bias circuit 5. Preferably, the bias voltage Vg and the bias voltage Vb are respectively connected from sides that are of the first bias circuit 4 and the second bias circuit 5 and close to the ground.

EMBODIMENT 5

Figure 9:
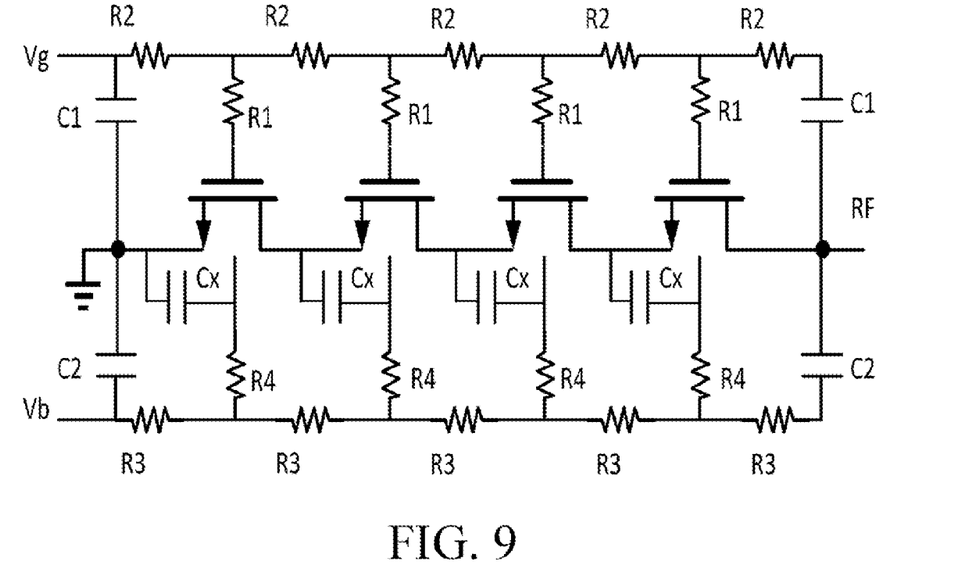
FIG. 9 is a circuit principle diagram of a radio frequency switch circuit according to an Embodiment 5 of the present invention.

As shown in FIG. 9, an example in which the switch units 3 respectively use NMOS transistors is used. Based on the radio frequency switch circuit provided in Embodiment 4, in a radio frequency switch circuit provided in this embodiment, a third capacitor Cx is disposed between the source and the body of the NMOS transistor of each of the switch units 3. The third capacitor Cx is used as a compensation capacitor of the switch unit 3. Alternatively, the third capacitor Cx may be disposed between the source and the gate of the NMOS transistor of each switch unit 3. The sizes of the NMOS transistors of the switch units may be different, and larger sizes of the NMOS transistors of the switch units 3 indicate larger parasitic capacitances. Therefore, a ratio of a parasitic capacitance between the NMOS transistors of the switch units 3 to a capacitance of the third capacitor Cx is adjusted, to improve voltage distribution uniformity on the switch chain when the radio frequency switch circuit is turned off, thereby improving the voltage withstanding ability of the radio frequency switch circuit and improving harmonic performance.

EMBODIMENT 6

Figure 10:
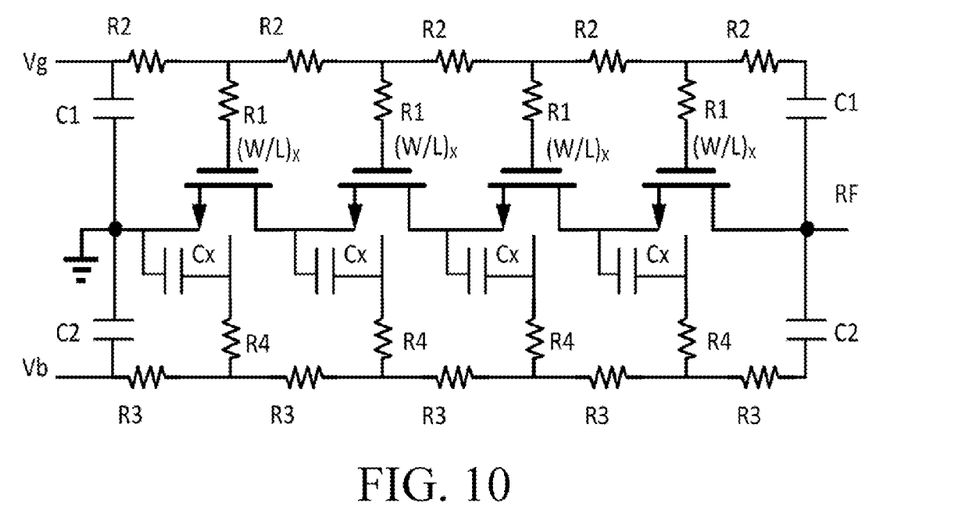
FIG. 10 is a circuit principle diagram of a radio frequency switch circuit according to an Embodiment 6 of the present invention.

As shown in FIG. 10, an example in which the switch units 3 respectively use NMOS transistors is used. Based on the radio frequency switch circuit provided in Embodiment 5, in a radio frequency switch circuit provided in this embodiment, the W/L ratio of the gate of the NMOS transistor of each switch unit 3 is further adjusted. Specifically, a voltage withstanding value of the NMOS transistor of each switch unit 3 is related to the length of the gate of the NMOS transistor. A larger length L of the gate of the NMOS transistor indicates a higher voltage withstanding value of the NMOS transistor, which is conducive to improving the voltage withstanding ability when the radio frequency switch circuit is turned off. However, when the NMOS transistor is turned on, the impedance of the NMOS transistor becomes higher, causing higher insertion loss. To maintain a proper insertion loss value, the width W of the radio frequency switch circuit may be increased. In this case, an overlap capacitance between the gate and the source of the NMOS transistor is increased, and poly contact on the drain and the source of the NMOS transistor increases the spacing as the length L of the gate increases, resulting in a decrease in the parasitic capacitance between NMOS transistors. In addition, the size of the NMOS transistor of each switch unit 3 and a ratio of the size to a size of the third capacitor Cx are adjusted, to improve voltage distribution uniformity on the switch chain when the radio frequency switch circuit is turned off. Adjusting the size of the NMOS transistor of each switch unit 3 is adjusting the W/L ratio of the gate of the NMOS transistor of the each switch unit 3.

Figure 11:
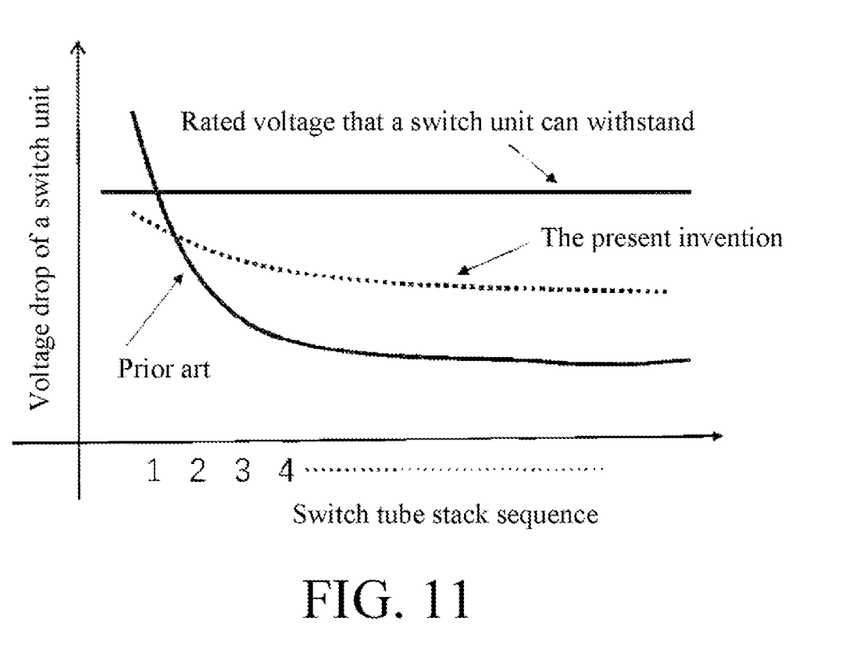
FIG. 11 is a schematic diagram of a relationship between a voltage swing on each switch unit and a switch tube stack sequence in a radio frequency switch circuit according to the present invention.

FIG. 11 reflects a relationship between a voltage swing on each switch unit and a switch tube stack sequence. Numbers 1, 2, 3, and 4 are respectively the first switch unit, the second switch unit, the third switch unit, and the fourth switch unit counted from an input end of a switch chain. A total quantity of switch units is not listed herein. A person skilled in the art should learn that a specific quantity of required switch units is related to factors such as a design index of a radio frequency switch circuit and processes. When a radio frequency switch circuit designed by using the prior art is used, switch units (for example, the first switch unit and the second switch unit in FIG. 11) close to an input end of a switch chain withstand larger voltage swings. In some application scenarios, a voltage swing withstood by a switch unit close to the input end of the switch chain is close to, or reaches, or even exceeds a rated voltage (a horizontal line in FIG. 11) that the switch unit can withstand. In this case, harmonics of the radio frequency switch circuit deteriorate rapidly, and irreparable damage even occurs. However, the radio frequency switch circuit provided in the embodiments of the present invention can reduce maximum voltages (shown by a dotted line in FIG. 11) withstood by easy-to-be-damaged switch units, to improve voltage distribution uniformity on a switch chain, thereby improving the overall voltage withstanding ability of the radio frequency switch circuit and reducing the occurrence of harmonics.

Compared with the prior art, in the radio frequency switch circuit provided in the present invention, a switch chain is formed by at least one switch unit disposed between the first port and the second port, each switch unit is connected to the first bias circuit and the second bias circuit, and the ratio of the parasitic capacitance between MOS transistors of the switch units to the capacitance of the third capacitor, the size of the MOS transistor of the each switch unit, and the ratio of the size to the size of the third capacitor are further adjusted. In this way, voltage distribution uniformity on the switch chain can be improved, thereby improving the overall voltage withstanding ability of the radio frequency switch circuit and reducing the occurrence of harmonics.

The radio frequency switch circuit provided in the present invention may be used in an integrated circuit chip. A specific structure of the radio frequency switch circuit in the integrated circuit chip is not described in detail herein again.

In addition, the radio frequency switch circuit may be further used in a communication terminal as an important component of a radio frequency circuit. The communication terminal herein is a computer device that can be used in a mobile environment and supports a plurality of communication standards such as GSM, EDGE, TD+SCDMA, TDD+LTE, and FDD+LTE. The computer device includes a mobile phone, a notebook computer, a tablet computer, an on-board computer, and the like. In addition, the technical solution provided in the present invention is also applicable to application scenarios of other radio frequency circuits, for example, a communication base station.

The radio frequency switch circuit, the chip, and the communication terminal provided in the present invention are described in detail above. For those of ordinary skill in the art, any obvious change made to the present invention without departing from the essential content of the present invention shall fall within the protection scope of the patent of the present invention.

What is claimed is:

1. A radio frequency switch circuit, comprising a first port and a second port, wherein a switch chain is formed by at least one switch unit being provided between the first port and the second port, each switch unit is connected to a first bias circuit and to a second bias circuit, and a first bias voltage (Vg) and a second bias voltage (Vb) are respectively connected from sides that are of the first bias circuit and the second bias circuit and close to the ground;

each switch unit comprises a metal-oxide-semiconductor (MOS) transistor, a first resistor is disposed between a source and a drain of the MOS transistor, and a gate and a body of the MOS transistor are respectively connected to corresponding bias circuits; a third capacitor is disposed between the source and the body of the MOS transistor of each switch unit and is used as a compensation capacitor of each switch unit;

the first bias circuit comprises at least one first T-shaped resistance network, each first T-shaped resistance network is correspondingly connected to a gate of one MOS transistor, and first capacitors are respectively disposed between the first T-shaped resistance network and the first port and between the last first T-shaped resistance network and the second port, wherein each of first capacitors is a parasitic capacitor formed between metals; and each first T-shaped resistance network comprises a second resistor, two adjacent first T-shaped resistance networks share a third resistor, two ends of the third resistor are correspondingly connected to ends of second resistors of the two adjacent first T-shaped resistance networks, the other end of the second resistor is connected to a gate of a corresponding MOS transistor, and one end of the second resistor of the first T-shaped resistance network and one end of the second resistor of the last first T-shaped resistance network are respectively connected to the corresponding first capacitors by using third resistors;

the second bias circuit comprises at least one second T-shaped resistance network, each second T-shaped resistance network is correspondingly connected to a body of one MOS transistor, and second capacitors are respectively disposed between the first second T-shaped resistance network and the first port and between the last second T-shaped resistance network and the second port; and each second T-shaped resistance network comprises a fourth resistor, two adjacent second T-shaped resistance networks share a fifth resistor, two ends of the fifth resistor are correspondingly connected to ends of fourth resistors of the two adjacent second T-shaped resistance networks, the other end of the fourth resistor is connected to a body of a corresponding MOS transistor, and one end of a fourth resistor of the first second T-shaped resistance network and one end of a fourth resistor of the last second T-shaped resistance network are respectively connected to the corresponding second capacitors by using fifth resistors;

wherein the radio frequency switch circuit is unidirectional, one of the first port and the second port is used as an input port of a radio frequency signal, and the other port is grounded; and a leakage of the radio frequency signal in a direction being blocked by using the second resistor to reduce loss of the radio frequency signal on the gate of the MOS transistor when the radio frequency switch circuit is turned on and voltage drops generated by the leakage current on the first T-shaped resistance networks being uniform between the drain and the source of each switch unit when the radio frequency switch circuit is turned off.

2. The radio frequency switch circuit according to claim 1, wherein
when the switch chain comprises one switch unit, an input end of the switch unit is connected to the first port, and an output end of the switch unit is connected to the second port.

3. The radio frequency switch circuit according to claim 1, wherein
when the switch chain comprises two or more switch units, an output end of each of the switch units is connected to an input end of a next switch unit, an input end of the first switch unit of the switch chain is connected to the first port, and an output end of the last switch unit of the switch chain is connected to the second port.

4. The radio frequency switch circuit according to claim 1, wherein
resistors in the first T-shaped resistance network and resistors in the second T-shaped resistance network respectively use variable resistor arrays.

5. An integrated circuit chip, comprising the radio frequency switch circuit according to claim 1.

6. A communication terminal, comprising the radio frequency switch circuit according to claim 1.

7. The radio frequency switch circuit according to claim 1, wherein
a ratio of a parasitic capacitance between MOS transistors to a capacitance of the third capacitor is adjusted, to improve voltage distribution uniformity on the switch chain when the radio frequency switch circuit is turned off.

8. The radio frequency switch circuit according to claim 7, wherein
a size of the MOS transistor of each switch unit and a ratio of the size to a size of the third capacitor are adjusted, to improve voltage distribution uniformity on the switch chain when the radio frequency switch circuit is turned off, wherein the size of the MOS transistor is a width/length (W/L) ratio of the gate of the MOS transistor.

* * * * *